United States Patent

Babb et al.

[11] Patent Number: 5,821,454
[45] Date of Patent: Oct. 13, 1998

[54] METHOD AND APPARATUS FOR REDUCING ELECTROMAGNETIC EMISSIONS FROM OPENINGS IN THE ENCLOSURE OF AN ELECTRONIC DEVICE

[75] Inventors: Samuel M. Babb; W. Peter Rawson, both of Ft. Collins, Colo.

[73] Assignee: Hewlett-Packard Co., Palo Alto, Calif.

[21] Appl. No.: 520,800

[22] Filed: Aug. 30, 1995

[51] Int. Cl.⁶ .................................................... H05K 9/00
[52] U.S. Cl. .................................... 174/35 TS; 361/816
[58] Field of Search ............................ 174/35 R, 35 MS, 174/35 TS, 35 GC; 361/816, 818; 333/12, 81 R; 342/1

[56] References Cited

U.S. PATENT DOCUMENTS

| | | | |
|---|---|---|---|
| 5,165,055 | 11/1992 | Metsler | 333/12 |
| 5,304,750 | 4/1994 | Schubert et al. | 181/294 |
| 5,539,148 | 7/1996 | Konishi et al. | 174/35 R |
| 5,576,413 | 11/1996 | Bussink et al. | 528/196 |
| 5,594,218 | 1/1997 | Diaz et al. | 181/295 |

*Primary Examiner*—Kristine L. Kincaid
*Assistant Examiner*—Kristina Soderquist
*Attorney, Agent, or Firm*—Edward L. Miller

[57] ABSTRACT

Unwanted RF emissions from an imperfect enclosure surrounding an electronic apparatus are reduced by first investigating the RF field strengths inside the enclosure while the apparatus is in operation, and identifying locations where the field strengths are significantly higher than elsewhere. The field strengths at these identified locations are then lowered significantly by placing lossy materials thereat to absorb and thus dissipate RF energy. If the lossy materials are placed in the near field of the actual circuitry that generates the RF then some of that RF is dissipated according to the degree of loading, but without associated reflected energy, and without the need for the lossy material to be a free field absorber that matches the characteristic impedance of the interior of the enclosure. A hybrid arrangement also exists where the lossy material is neither a free field absorber nor located in the near field of the generator, so long as it is located in the near field of a reflector. Thus, a significant portion of the RF that would otherwise leak out is absorbed before it gets the chance, thus reducing the absolute amount of energy that does leak out.

3 Claims, 1 Drawing Sheet

METHOD AND APPARATUS FOR REDUCING ELECTROMAGNETIC EMISSIONS FROM OPENINGS IN THE ENCLOSURE OF AN ELECTRONIC DEVICE

BACKGROUND OF THE INVENTION

The regulatory environment in which today's electronic equipment is sold and operated is considerably more demanding that it used to be. The proliferation of and increasing demand for communications devices that operate in ever higher portions of the radio frequency spectrum on the one hand, coupled with ever faster processing elements in such items as computers and microprocessor controlled equipment on the other, have prompted regulatory bodies to require that certain classes of equipment be certified as meeting established standards for radiated electromagnetic energy. For example, the FCC now imposes limits on the amounts of energy radiated in the range of from 1 GHz to 2 GHz. In a related area of concern, there are classes of users of electronic equipment that wish to prevent surreptitious monitoring by others of their use of the equipment. For example, a government agency or industrial organization may wish to keep an espionage agent from monitoring what is being printed on a printer or the traffic to a disc drive by aiming an antenna at the equipment and analyzing the received signals.

One way to meet the regulatory requirements is to thoroughly shield the equipment, with lots of screws on cover plates and RF gaskets at the joints of the shield, etc. It is not so much that this cannot be done; it is more that it is costly and not in keeping with the mass production of consumer and industrial goods; e.g., personal computers and workstations. There are a number of reasons for this, and they include: (1) As the frequencies of interest increase, it is simply more difficult to be effective with traditional techniques; (2) Slot-shaped openings are a natural artifact of sheet metal forming and fit, especially for card cages where optional items are installed either through or against the case with a sliding action; (3) Maintenance folks are notorious for not always putting all the screws back in place, and RF gaskets can become worn or damaged. Ventilation holes seem not to be a real problem, as they are readily screened with a conductive mesh. But in places where the case parts assemble and disassemble and in places where expansion elements are installed or removed, RF is apt to leak out and present a regulatory compliance problem for the designer.

SUMMARY OF THE INVENTION

A solution to the problem of unwanted RF emissions from an imperfect enclosure around an electronic apparatus is to investigate the RF field strengths inside the enclosure while the apparatus is in operation, and identify locations where the field strengths are significantly higher than elsewhere. The field strengths at these identified locations are then lowered significantly by placing lossy materials thereat to absorb and thus dissipate RF energy. If the lossy materials are placed in the near field of the actual circuitry that generates the RF then some of that RF is dissipated according to the degree of loading, but without associated reflected energy, and without the need for the lossy material to be a free field absorber that matches the characteristic impedance of the interior of the enclosure. A hybrid arrangement also exists where the lossy material is neither a free field absorber nor located in the near field of the generator, so long as it is located in the near field of a reflector. In any of these arrangements, the lossy material does not plug the leak, so to speak. Instead, a significant portion of that which would otherwise leak out is absorbed before it gets the chance, thus reducing the absolute amount of energy that does leak out. Suitable lossy materials include the stuff used in anechoic RF test chambers.

DESCRIPTION OF A PREFERRED EMBODIMENT

Figure 1:
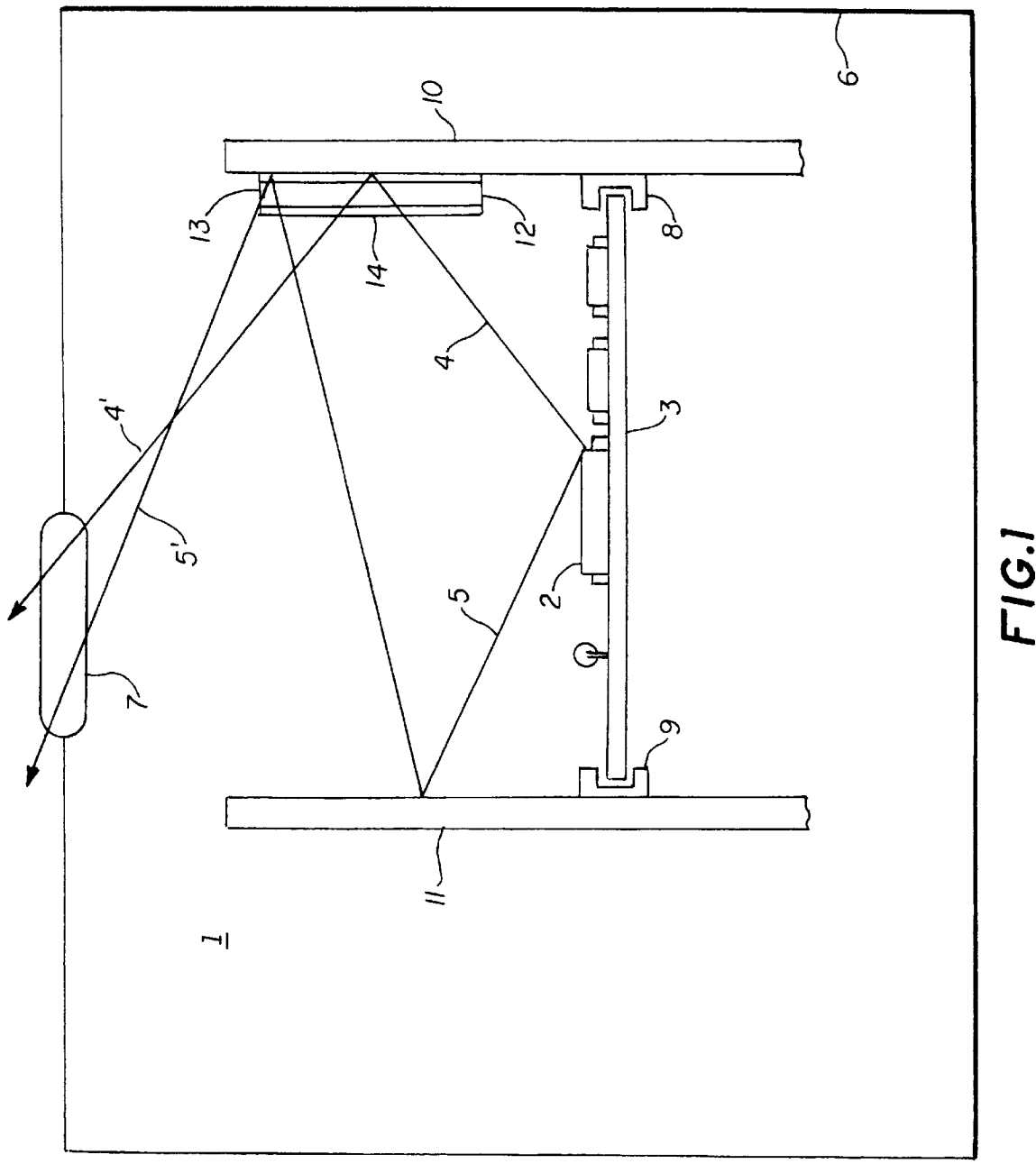
FIG. 1 is a simplified schematic representation of a particular example of an electronic circuit that is enclosed within a housing and that radiates electromagnetic energy which is then absorbed by lossy material inside the enclosure before escaping through an orifice.

Refer now to FIG. 1, wherein is shown an example schematic representation of what happens within an enclosure housing an electronic circuit which generates radiation when in operation. Specifically, FIG. 1 shows an arrangement 1 wherein a component 2 upon a circuit board 3 emits, in different directions, electromagnetic radiation 4, 5. The circuit board 3 is enclosed by an enclosure 6 in which there is a slot or orifice 7. The circuit board 3 may be carried by board guides 8 and 9 mounted into sheet metal partitions 10 and 11. A lossy absorber 12 is attached to partition 10 to absorb a portion of electromagnetic radiation 4 and 5 that is emitted the component 2 and that escapes from the enclosure 6 as 4' and 5' through slot or orifice 7.

Before pursuing this figure further, we should point out that it is not intended to be a pictorial view of an actual three dimensional instance of emitting and absorbing radiation inside an enclosure. That is, it is neither a sectional nor an end view. It is best thought of as a schematic, or perhaps as a block diagram. Just as the schematic of a circuit describes the electrical relationships between various components without attempting to describe their physical appearance or spatial relationships, FIG. 1 describes certain electrical and spatial relationships without describing any particular actual physical appearance. The figure should be further understood as representative of a wide range of electrical and spatial relationships, and not just exactly those specifically shown therein. On the other hand, a figure that was a true schematic or true block diagram, while understandable with suitable legends (there being no standard accepted symbolism), would likely convey the idea in the abstract without the desirable suggestion of its physical realization. FIG. 1 is, in a sense, a hybrid intended to do both.

To return now to the figure, component 2 represents any single component or a plurality of components that radiate electromagnetic radiation when the circuitry on the circuit board 3 is in operation. For example, component 2 could be a microprocessor or it could be a clock driver. It could also represent an entire collection of line drivers associated with a bus. It should be further borne in mind that there might be multiple instances of component 2's, and that they might not all be in the same general location on the circuit board 3.

As shown in the figure, electromagnetic radiation 4 reflects off partition 10 and then out through orifice 7, while electromagnetic radiation 5 reflects off partition 11, then off 10 and goes out through orifice 7. In any actual embodiment there will probably be more surfaces that electromagnetic energy reflects from, including the enclosure 6 itself, and there may very well be more than one orifice. It will readily be appreciated that a description of the true state of affairs for the radiated electromagnetic energy (4 and 5) inside the enclosure 6 is very complicated indeed, and that it is strong function of what things are radiating, where they are, and what they reflect off of, as well as what re-reflections occur.

As indicated by the figure, lossy material 12 absorbs a portion of electromagnetic radiation 4 so that only a significantly reduced amount 4' reaches orifice 7. Lossy material 12 also absorbs a portion of electromagnetic radiation 5, so that only a significantly reduced portion 5' reaches orifice 7. Lossy material 12 is affixed to the partition 10 by a layer of adhesive 13. In one actual embodiment the arrangement 1 is a Hewlett-Packard Series 700 Work Station and lossy material 12 is a one centimeter thick by 8½ by 2½ inch piece of LS-26 from Emerson & Cuming, Inc., 77 Dragon Court, Woburn, Mass. 01888. Emerson and Cuming manufactures a series of materials LS-14, LS-16, LS-18 . . . LS-30, which are increasingly heavier loads on an electric field. These LS-materials are open cell carbon loaded polyurethane foam. LS-30 has a higher concentration of carbon particles than does LS-16. The LS-family of materials is usable as an absorber in the frequency range of from around 10 MHz to about 2 GHz.

Also usable as lossy material 12 is another family of material from Emerson & Cuming. These are their ECCOSORB MF-S series, such as MF-S-124 and MF-S-117, MF series and FDS series. These are silicone rubber sheets that contain particles that load an applied magnetic field. These materials are believed useful over the range of from around 500 MHz to about 10 GHz.

The situation envisioned in FIG. 1 supposes, at least for electromagnetic radiation 4, that the lossy material 12 is in the near field of component 2. The near field is the electric (or magnetic) field that originates from the EMF across the component 2 (or from the current through it), and that is present in a region of space without resort to self-sustaining propagation. It one could freeze time and examine the near field, it would appear to be a "DC phenomenon" arising from the component 2, rather than from a preceding cycle of propagating electromagnetic energy. What is special about lossy material 12 being in the near field of component 2 is that the lossy material 12 can load the near field and absorb energy from it without matching the 377Ω impedance of free space. A near field that loses energy to an absorber transmits less to the far field, and thus reduces the total amount of energy available to escape through orifice 7 in the first place. Thus, as long as the lossy absorber is in the near field of the source (component 2), generally equivalent results can be expected from either increasing the thickness of the lossy absorber or from using a thinner sheet that is more heavily loaded with absorbing material. Note also that lossy material 12 operates twice on electromagnetic radiation along path 4: once as path 4 passes through lossy material 12, and once again as what energy is left reflects from partition 10 and passes through through lossy material 12 a second time along path 4'.

If the lossy material 12 is polyurethane foam it may be desirable to increase its fire resistance to meet certain standards, such as UL 94 HBF. This may be done by spraying it with a suitable material, or by simply covering it with a barrier 14 of, say, polycarbonate (e.g., sheet polycarbonate labeling material).

Depending upon the frequency of the electromagnetic radiation of interest, and upon the size of the enclosure and spacing between components, a path 5 of electromagnetic radiation may exist wherein the lossy absorber 12 is not in the near field of the source component 2. The need to match free space can be avoided in at least the following ways: First, an intervening reflection acts as a source in its own right (think of the short-circuited surface currents induced by the arriving energy), so it may be possible that the lossy material is in its near field. Next, it may be possible to dispose additional lossy material inside the enclosure so that some of it is in the near field of the original source. Finally, one could put some free field absorber into the enclosure. A free field absorber is material that either directly matches the 377Ω of free space, or is a multi-layer sandwich of different materials (a "graded" absorber) whose overall effect is to approximate such a direct match.

To consider the non-near field case further, suppose that a sheet of lossy material is in the path of a propagating signal, but is not in the near field. If the lossy material is a very heavy load the the degree of mis-match is high, and the lossy material simply acts as a reflector without absorbing energy. If the lossy material is a very light load then it is transparent, but does not absorb, either. An interesting case is one where the lossy material is not in the near field and is adhered to a reflective surface, such as a metal partition of a surface of the enclosure. There will be an optimum value for the degree of loading that minimizes the initial reflection from the lossy material and maximizes energy absorbed during the initial entry through the lossy material and from the reentry from the reflection off the reflective surface. Unfortunately, things won't be as simple as having one narrow beam of energy. The inside of the enclosure is filled with multiple reflections from a plurality of sources, and the level of complexity is so high as to resemble confusion. Experimentation will probably need to be relied upon to determine the optimum degree of loss in such a far field case.

The same internal complexity and confusion also prevents a beforehand analysis of where to locate the lossy material in any case, near or far field. There is, however, no need to resort to guess work. An operating prototype is simply outfitted with suitable measurement capability and the field intensities inside the enclosure measured at a variety of locations (e.g., drill holes in the enclosure and probe them with a suitable probe connected to a spectrum analyzer). Any location where the measured field is three or four times higher than elsewhere is a prime candidate for lossy material. It is reasonable to expect that this procedure can result in as much as a 20 db reduction in the amount of unwanted electromagnetic radiation escaping from the enclosure.

We claim:

1. Electronic apparatus comprising:

circuitry that radiates radio frequency energy when operating;

an enclosure enclosing the circuitry and having at least one orifice therein through which a portion of the radio frequency energy radiated by the circuitry escapes from the enclosure;

a surface within the enclosure which reflects the radio frequency energy radiated by the circuitry;

a volume of lossy material that absorbs said radiating radio frequency energy and that is disposed:

inside the enclosure at a location where there is a greater amount of said radio frequency energy than at other locations inside the enclosure, there being an absence of such a volume of lossy material at at least one such other location;

inside the near field of the radio frequency energy reflected from the surface;

outside the near field of the circuitry that radiates the radio frequency energy;

the volume of lossy material presenting a mismatch to propagating radio frequency energy incident there-upon and only a portion of said propagating radio frequency energy entering the volume of lossy material; and, the volume of lossy material is of a degree of lossiness selected to maximize the amount of said radio frequency energy that is absorbed as the entering portion of said radio frequency energy initially enters the volume of lossy material on one side and subsequently renters it on an opposite side after reflecting from the surface.

2. The electronic apparatus of claim 1 wherein the volume of lossy material is of material that affects the electric field of the radiating radio frequency energy.

3. The electronic apparatus of claim 1 wherein the volume of lossy material is of material that affects the magnetic field of the radiating radio frequency energy.

\* \* \* \* \*